United States Patent [19]

Suzuki et al.

[11] 4,427,947
[45] Jan. 24, 1984

[54] PHASE DISCRIMINATOR CIRCUIT

[75] Inventors: Sunao Suzuki, Kobe; Genzaburou Kotani, Akashi, both of Japan

[73] Assignee: Mitsubishi Denki Kabushiki Kaisha, Tokyo, Japan

[21] Appl. No.: 293,988

[22] Filed: Aug. 18, 1981

[30] Foreign Application Priority Data

Sep. 10, 1980 [JP] Japan .................... 55-125810

[51] Int. Cl.³ .............. H03K 9/06; H03K 5/13; H03K 5/22
[52] U.S. Cl. .................... 328/133; 328/155; 307/510
[58] Field of Search ............ 328/133, 127, 146, 149, 328/150, 151, 155; 307/546, 549, 553

[56] References Cited

U.S. PATENT DOCUMENTS

| | | | |
|---|---|---|---|
| 3,743,951 | 7/1973 | Carroll | 328/127 |
| 4,053,940 | 10/1977 | Hinman, Jr. et al. | 361/84 |
| 4,225,795 | 9/1980 | Keeney | 307/528 |
| 4,306,297 | 12/1981 | Sugihara et al. | 328/133 |
| 4,371,974 | 2/1983 | Dugan | 328/133 |

OTHER PUBLICATIONS

The General Electric Company, Ltd., Instruction and Maintenance Manual: Distance Protection Relay.

A. R. van C. Warrington, Protective Relays: Their Theory and Practice (vol. Two).

*Primary Examiner*—Stanley D. Miller
*Assistant Examiner*—Timothy P. Callahan
*Attorney, Agent, or Firm*—Wenderoth, Lind & Ponack

[57] ABSTRACT

An integrating phase discriminator circuit has an integration circuit including an operational amplifier to integrate bidirectional rectangular waveforms originating from those portions of two AC inputs having the same polarity. When an integrated value reaches an operating detecting level $V_{D11}$ of a level detector when said level is equal to an integrated value $V_H$ for a phase difference of 90° between the two inputs, an inoperative signal from the level detector changes to an operating signal. This causes an R-C differentiation circuit to apply a position pulse to the operational amplifier to forcibly raise the integrated value of its upper limit $E_P$ while a control circuit changes $V_{D11}$ to a reset detecting level $V_{D22}=E_P-V_H$ in the level detector, resulting in the continuous delivery of the operating signal. When the integrated value decreases to $V_{D22}$, the level detector delivers the inoperative signal. The differentiation circuit then generates a negative pulse for forcibly lowering the integrated value to its lower limit of 0 through an operational amplifier. The level detector continuously delivers the inoperative signal while it has the detecting level changed from $V_{D22}$ to $V_{D11}$ by the control circuit.

3 Claims, 10 Drawing Figures

PHASE DISCRIMINATOR CIRCUIT

BACKGROUND OF THE INVENTION

This invention relates to an integrating phase discriminator which is disposed on a power system to protect system equipment.

A conventional phase discriminator circuit of the type referred to has comprised: a pair of rectangular waveshaping circuits for respectively converting a first and a second AC input to corresponding rectangular waveforms; an adder circuit for adding the converted rectangular waveforms together to form the sum thereof; a full-wave rectifier circuit for full-wave rectifying the sum from adder circuit; a zero shifting circuit for shifting a zero level of an output voltage from the full-wave rectifier circuit; an integration circuit for integrating the zero shifted voltage; a level detector circuit which is responsive to an integrated voltage in excess of an operation detecting level from the integration circuit for delivering an operating signal and which is also responsive to an integrated voltage which is less than a reset detecting level for delivering an inoperative signal; and a control circuit for deciding whether an output from the level detector circuit is the operating or inoperating signal. When the output from the level detector circuit is the inoperative signal, as decided thereby, the control circuit delivers an operating signal. On the detector circuit other hand, when that output is the operating signal, as decided thereby, the control circuit delivers a resetting signal.

The phase discriminator circuit as described above has determined the phase relationship between the first and second AC inputs so that the inoperative signal is delivered when the phase difference is not less than 90 degrees between the two AC inputs and the operative signal is delivered when the phase difference is less than 90 degrees.

Conventional integrating phase discriminator circuits such as described above have been disadvantageous in that, with the phase difference between the two AC inputs approximating 90 degrees, operation and reset sensing times are delayed.

Accordingly, it is an object of the present invention to provide a new and improved phase discriminator circuit which operates and resets fast and which has means for preventing the operation and reset setting from being delayed.

SUMMARY OF THE INVENTION

The present invention provides an integrating phase discriminator circuit comprising: a circuit for delivering an output when first and second AC electric signals are identical in polarity to each other; a zero shifting circuit for shifting a zero level of the output from the circuit; an integration circuit for integrating an output from the zero shifting circuit; a level detector circuit having a first detecting level and a second detecting level which is lower than the first detecting level, wherein said level detector circuit changes output level therefrom in accordance with whether or not an output from the integration circuit reaches either of the first and second detecting levels; and a holding circuit for holding the output level from the level detector circuit at a predetermined level by sensing an output from the level detector circuit which is changing to the predetermined level.

Preferably, the holding circuit may include a differentiation circuit for sensing a change in output level from the level sensor circuit and feeding the sensed change in output level back to the integration circuit.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENT

Figure 1:
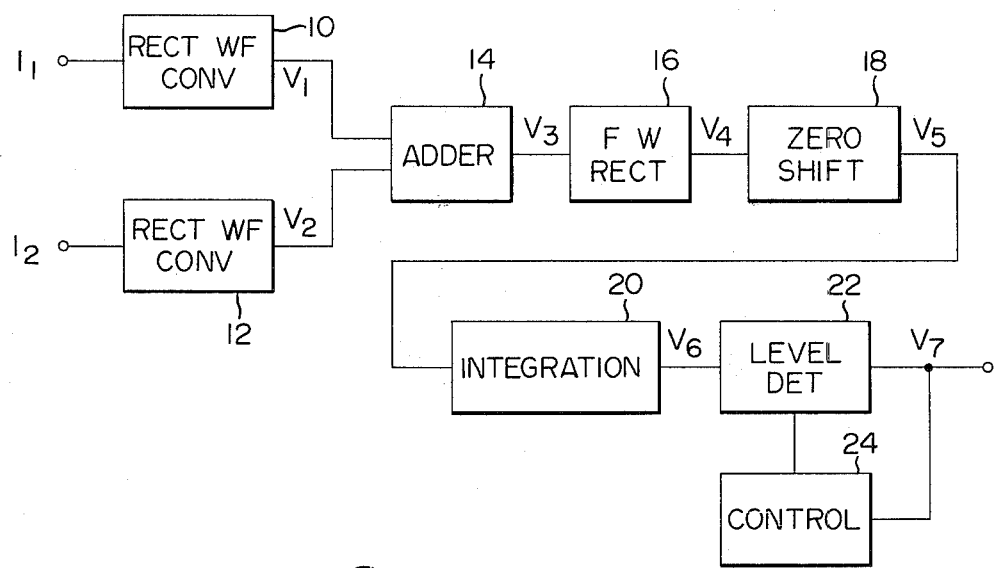
FIG. 1 is a block diagram of a conventional integrating phase discriminator circuit.

Referring now to FIG. 1 of the drawings, there is illustrated a conventional integrating phase discriminator circuit for a protective relay equipped on a power system to protect equipment which is operatively coupled to the power system. The illustrated arrangement comprises a pair of first and second rectangular waveform converter circuits 10 and 12 for respectively converting first and second AC electric signals or inputs $I_1$ and $I_2$ to corresponding rectangular waveforms $V_1$ and $V_2$ respectively; an adder circuit 14 for adding the rectangular waveforms $V_1$ and $V_2$ from the first and second converter circuits 10 and 12 together to form the sum thereof; and a full-wave rectifier circuit 16 for full-wave rectifying the sum of the rectangular waveforms $V_1+V_2$ into a full-wave rectified voltage $V_4$. The arrangement further comprises a zero shifting circuit 18 for shifting a zero point of the voltage $V_4$ from the full-wave rectifier circuit 16; an integration circuit 20 for integrating a zero shifted voltage $V_5$ from the zero shifting circuit 18; and a level detector circuit 22 for detecting a level of an integrated voltage $V_6$. The level detector circuit 22 is operative to deliver an operating signal in response to the integrated voltage $V_6$ having a level which is not less than an operation detecting level and to deliver an inoperative signal in response to that voltage $V_6$ having a level which is not higher than a reset detecting level. A control circuit 24 is connected to the level detector circuit 22 to decide whether an output voltage $V_7$ from the level detector circuit 22 is the operating or inoperative signal so as to control a detecting level of the circuit 22 to the operation detecting level (which is designated hereinafter by $V_{D1}$) when the level detector circuit 22 delivers the inoperative signal as decided by the control circuit 24 and to the reset sensing level (which is designated by $V_{D2}$) when the level detector circuit 22 delivers the operating signal as decided by the control circuit 24.

The arrangement of FIG. 1 determines the phase relationship between the first and second AC inputs $I_1$ and $I_2$ so that the inoperative signal is delivered when a phase difference therebetween is not less than 90 degrees and the operative signal is delivered when the phase difference is less than 90 degrees.

Figure 2:
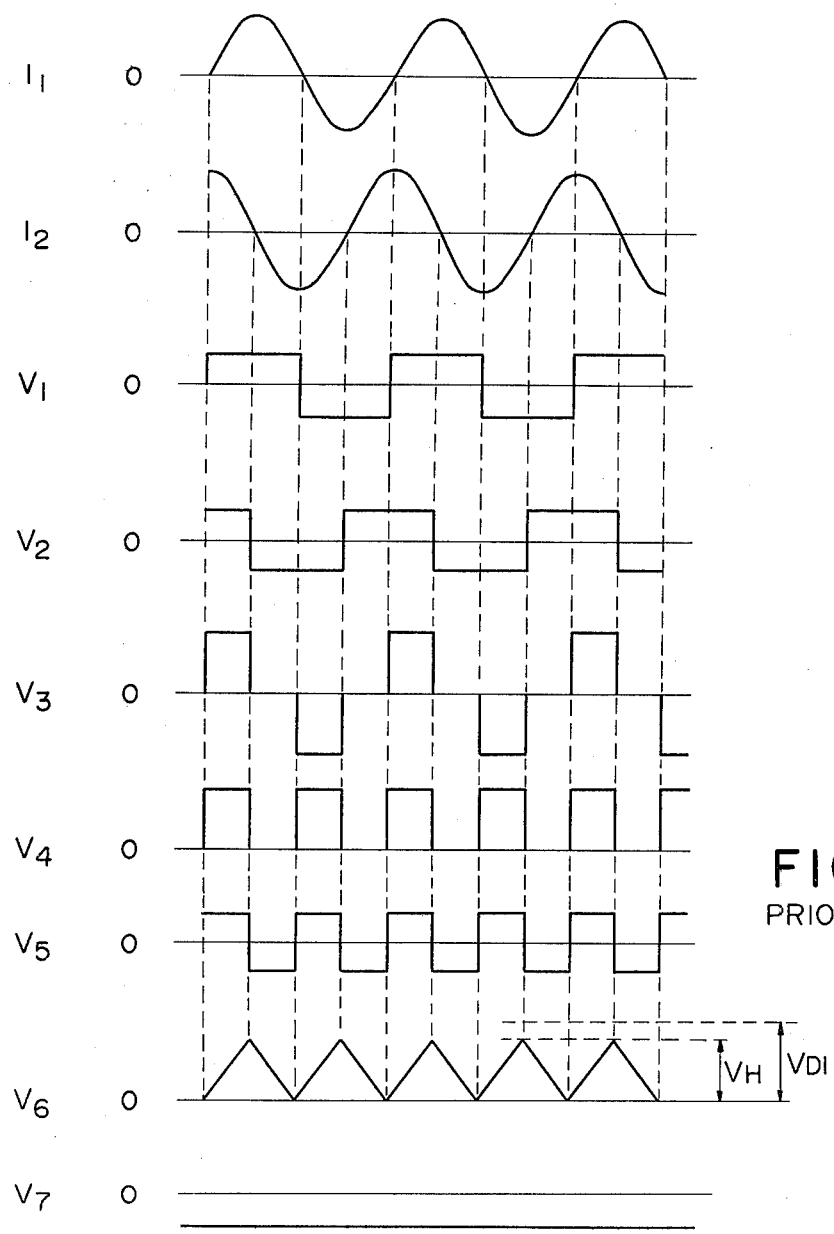
FIG. 2 is a graph illustrating waveforms developed at various points in the arrangement shown in FIG. 1 when the arrangement is at an operating limit.
Figure 3:
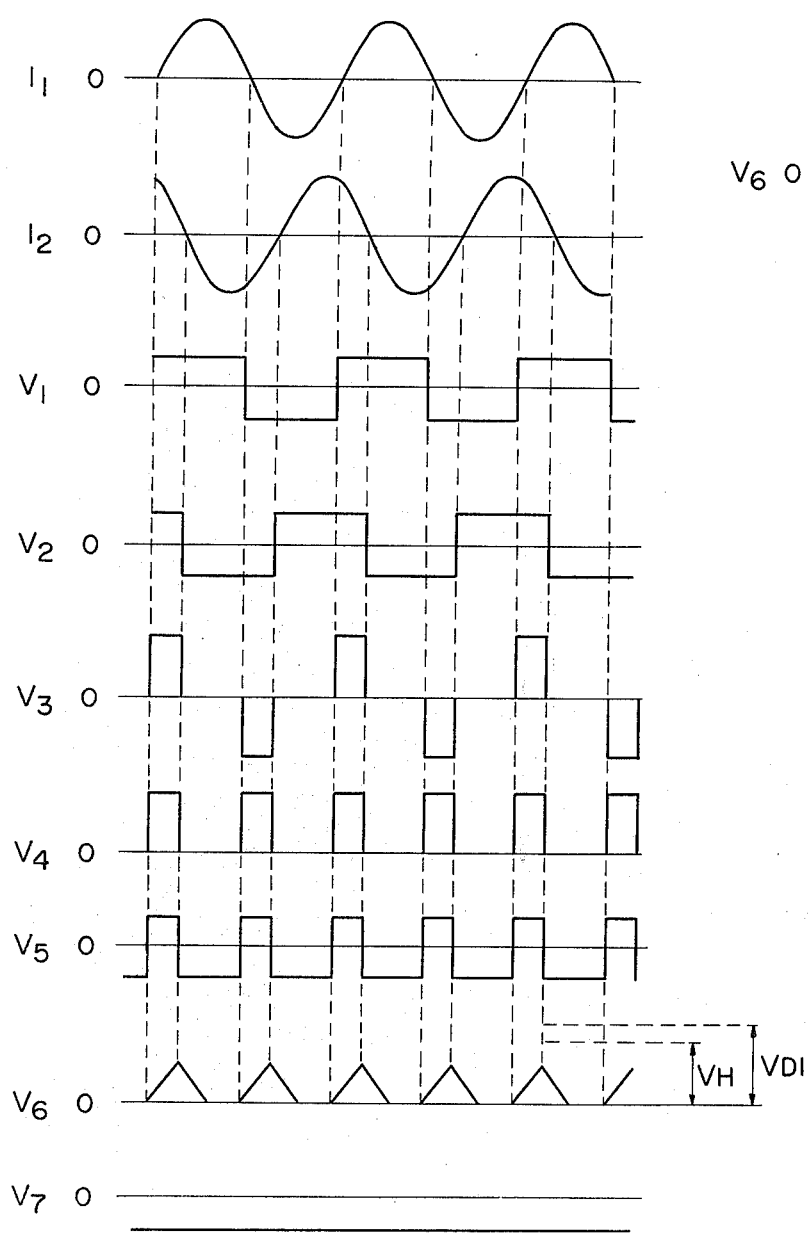
FIG. 3 is a graph which is similar to FIG. 2 but illustrating the inoperative state of the arrangement shown in FIG. 1.
Figure 4:
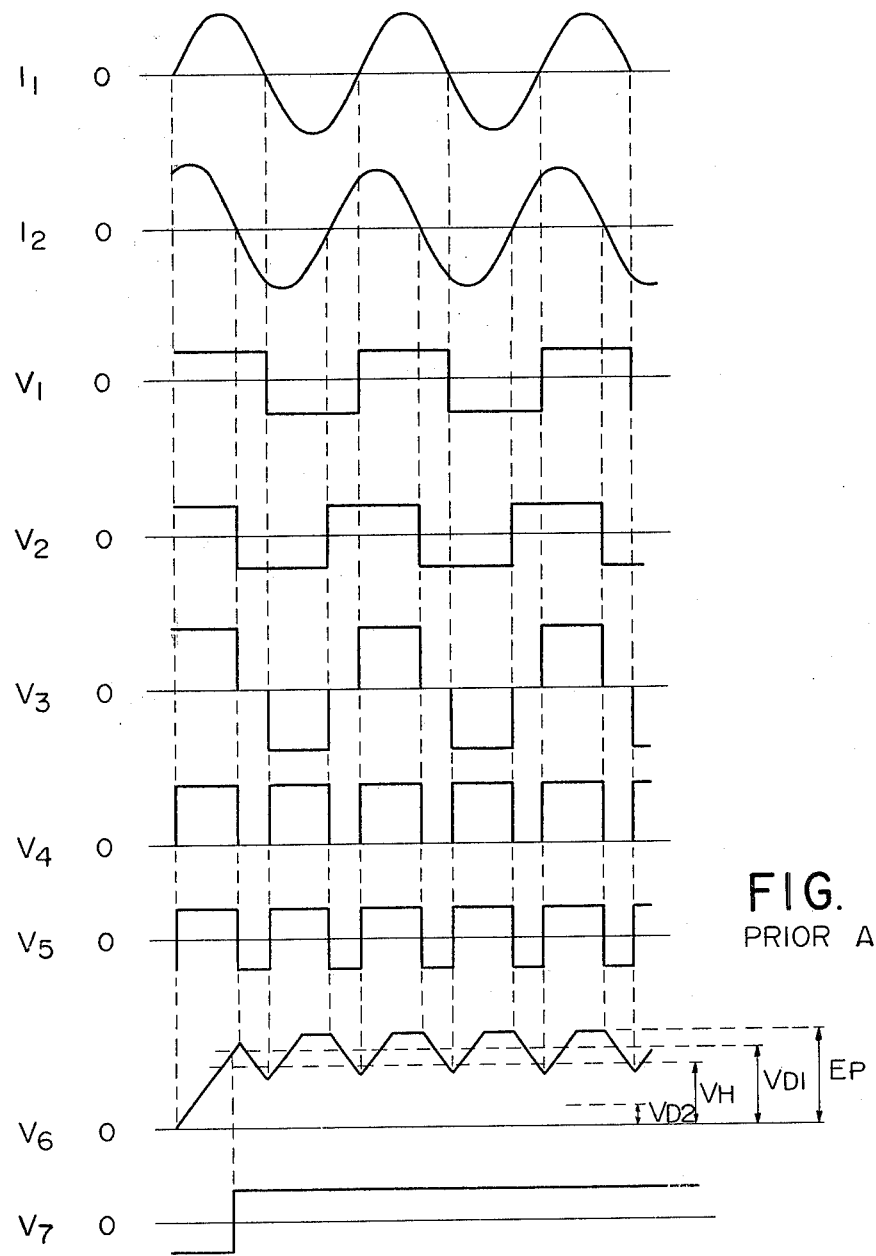
FIG. 4 is a graph which is similar to FIG. 2 but illustrating the operating state of the arrangement shown in FIG. 1.

The operation of the arrangement shown in FIG. 1 will now be described in conjunction with FIGS. 2, 3 and 4 wherein there are illustrated waveforms developed at various points in the arrangement put when the arrangement is respectively at its operating limit, in its inoperative state and is in its operating state. The waveforms shown in each of FIGS. 2, 3 and 4 are designated by like reference characters suffixed with the reference numerals identifying the corresponding currents and output voltages shown in FIG. 1. For example, $I_1$ designates the waveform of the first AC input $I_1$ in the form of a current applied to the first rectangular waveform converter circuit 10 and $V_1$ designates the waveform of the output $V_1$ from the converter circuit 10.

In FIG. 2, the first and second AC inputs $I_1$ and $I_2$ have a phase difference of 90 degrees therebetween and the arrangement of FIG. 1 is shown as being at its operation limit. As described above, those AC inputs $I_1$ and $I_2$ are applied to the first and second rectangular waveform converter circuits 10 and 12 to be converted to the first and second rectangular waveforms $V_1$ and $V_2$. As shown by waveforms $V_1$ or $V_2$ in FIG. 2, a positive portion of each AC input is converted to a positive rectangular waveform portion while a negative portion thereof is converted to a negative rectangular waveform portion with both waveform portions equal in amplitude to each other.

The adder circuit 14 adds the first waveform $V_1$ to the second waveform $V_2$ to produce the sum of those waveforms including positive rectangular waveform portions alternating with negative rectangular waveform portions with an equal time interval formed between each pair of positive and negative rectangular waveform portions as shown at waveform $V_3$ in FIG. 2. Then, the sum $V_3$ from the adder circuit 14 is full-wave rectified into the rectified voltage $V_4$ (see waveform $V_4$, FIG. 2) by the full-wave rectifier circuit 16. Then, the rectified voltage $V_4$ is subjected to the zero shift in the zero shifting circuit 18. The resulting zero shifted voltage $V_5$ is shown by waveform $V_5$ in FIG. 2 as including positive rectangular waveform portions alternating with negative rectangular waveform portions which are equal in amplitude thereto. Also, the positive rectangular waveform portion is developed for a time interval for which the first AC input $I_1$ is identical in polarity to the second AC input $I_2$ while the negative rectangular waveform portion is developed for a time interval for which the AC input $I_1$ is opposite in polarity to the second AC input $I_2$. Since FIG. 2 shows a phase difference of 90 degrees between the first and second AC inputs $I_1$ and $I_2$, the positive rectangular waveform portion from the zero shifting circuit 18 is equal in duration to the negative waveform portion therefrom.

Waveform $V_6$ shows the output voltage $V_6$ from the integration circuit 20 resulting from the integration of the zero shifted voltage $V_5$ delivered by the zero shifting circuit 18. Assuming now that the integration circuit 20 has a time constant during charge equal to that during discharge, the output voltage $V_6$ from the integration circuit 20 is in the form of a triangular waveform as shown at waveform $V_6$ in FIG. 2. This is because the positive rectangular waveform portions from the zero shifting circuit 18 is equal in both duration and amplitude to the negative rectangular waveform portions therefrom as described above.

It is now assumed only for convenience of the succeeding description that $V_H$ designates an integrated value to which the integration circuit 20 is charged for a time interval for which the phase of the first AC input $I_1$ changes from zero to 90 degrees and which is discharged by the integration circuit 20 and for the next succeeding interval equal to that described above. The value $V_H$ may be called hereinafter an integrated value for the phase of 90 degrees.

The level detector circuit 22 has the abovementioned operation sensing level $V_{D1}$ which is, in turn, preset so as to be higher than the integrated value $V_H$ (see waveform $V_6$, FIG. 2). In the illustrated example, since the output voltage $V_6$ from the integration circuit 20 never exceeds the integrated value $V_H$, the output voltage $V_7$ from the level detector circuit 22 is at a negative level as the inoperative signal as shown by waveform $V_7$ in FIG. 2.

FIG. 3 shows the arrangement of FIG. 1 when it is in its inoperative state by having the phase difference between the first and second AC inputs $I_1$ and $I_2$ which is more than 90 degrees (see waveforms $I_1$ and $I_2$, FIG. 3). Waveforms $V_1$, $V_2$, $V_3$, $V_4$ and $V_5$ shown in FIG. 3 are derived in the same manner as described above in conuunction with FIG. 2.

Waveform $V_6$ shown in FIG. 3 also designates the output voltage $V_6$ from the integration circuit 20. In FIG. 3, a time interval for which the first AC input signal $I_1$ is identical in polarity to the second AC input signal $I_2$ is shorter than a time interval for which the two signals $I_1$ and $I_2$ are opposite in polarity to each other so that the integration circuit 20 has its charging quantity greater than its discharging quantity. Thus, the output voltage $V_6$ from the integration circuit 20 does not reach the operation detecting level $V_{D1}$ (see waveform $V_6$ of FIG. 3) resulting in the level detector circuit 22 delivering the inoperative signal with a negative level as shown by waveform $V_7$ in FIG. 3.

FIG. 4 shows the arrangement of FIG. 1 when it is in its operating state by having the phase difference between the two AC input $I_1$ and $I_2$ which is less than 90 degrees (see waveforms $I_1$ and $I_2$, FIG. 4). Waveforms $V_1$, $V_2$, $V_3$, $V_4$ and $V_5$ are derived in the same manner as in case of FIG. 2.

In FIG. 4, waveform $V_6$ similarly designates the output voltage $V_6$ from the integration circuit 20 but it reaches at least the operation sensing level $V_{D1}$ and is shown by waveform $V_6$ as exceeding the level $V_{D1}$. This is because a time interval of the two AC input signals $I_1$ and $I_2$ having the similar polarity is longer than that of their having the dissimilar polarity and therefore the integration circuit 20 has its charging quantity greater than its discharging quantity. As a result, the level detector circuit 22 delivers the output voltage $V_7$ at its positive level as shown by waveform $V_7$ in FIG. 4. In other words, the operating signal is developed as the output voltage $V_7$.

It is now assumed that the control circuit 24 is omitted from the arrangement of FIG. 1. Under the assumed conditions, the output voltage $V_6$ from the integration circuit 20 reaches the operation sensing level $V_{D1}$ once to permit the level detector circuit 22 to deliver the operating signal. However, during the next succeeding discharge time the integrated output voltage $V_6$ decreases to a level which is less than the operation sensing level $V_{D1}$. Thus, the arrangement of FIG. 1 without the control circuit 24 is put back in its inoperative state. This results in the occurrence of phenomenon wherein the operation and non-operation states are repeated in an alternating relationship.

The control circuit 24 is initiated from the level detector circuit 22 and, once the circuit 24 is in operation, controls the discharge circuit of detector circuit 24 by changing reset detecting level $V_{D2}$. This control can prevent the occurrence of the phenomenon wherein the operation and non-operation states are repeated.

The repetition of the operation states and non-operation has been described in conjunction with the transition from the inoperative to the operating state but the repetition similarly occurs during the transition from the operating to the inoperative state. More specifically, the output voltage $V_6$ from the integration circuit 20 is decreased to less than the reset detecting level $V_{D2}$ and reset. This also results in the phenomenon wherein the operation and non-operation states are repeated. Under these circumstances, the control circuit 24 is responsive to the inoperative signal from the level detector circuit 22 to change the detecting level of the latter circuit to the operation detecting level $V_{D1}$ so as to thereby prevent the repetition of the operation and non-operation.

Figure 5:
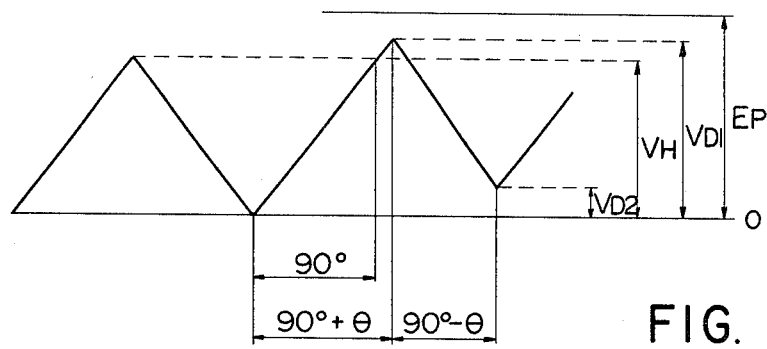
FIG. 5 is a graph illustrating the relationship between a dynamic range of an electric source and a detecting level.

FIG. 5 shows a first and a second integrated waveform from the integration circuit 20 when the phase difference between the two AC inputs is greater than 90 degrees and also describes the relationship between the detecting levels of the level detector circuit 22 and a dynamic range of the control circuit 24. As shown in FIG. 5, the control circuit has a voltage thereacross ranging from O to $E_P$ in volts. The first wave of the output voltage $V_6$ from the integration circuit is in the form of an equilateral triangle with its vertex having the integrated value $V_H$ at a phase of 90 degrees like the waveform $V_6$ shown in FIG. 2. The second wave from the integration circuit 20 reaches the operation detecting level $V_{D1}$ at the end of a second charge time corresponding to a phase interval of $(90+\theta)$ degrees and reaches the reset detecting level $V_{D2}$ at the end of the next succeeding discharge time corresponding to a phase interval of $(90-\theta)$ degrees.

The reset detecting level $V_{D2}$, the integrated value $V_H$ at the phase of 90 degrees, the operation detecting level $V_{D1}$ and the voltage $E_P$ across the control source are required to fulfill the relationship $$O < V_{D2} < V_H < V_{D1} < E_P$$

as shown in FIG. 5 and for the following reasons:

(1) Since the integrated value has an upper which is equal to the source voltage $E_P$, the integration circuit 20 is required to have a time constant which is arranged so as not to render $V_H$ higher than $E_P$.

(2) If the operation detection can not be performed upon the upper limit of the integrated value reaching $E_P$, then the meaning of the operation detection is lost. Therefore, $V_{D1}$ is necessarily less than $E_P$. This is because $V_{D1}$ is required to be preliminarily less than $E_P$ in order to prevent the detection from being disabled upon the integrated value reaching $E_P$ due to a change in temperature of each of the particular electronic components which determine set values of the detecting levels.

(3) It is required to render $V_{D2}$ higher than the 0 volt lower limit of the source voltage for the same reason as described above in Item (2). That is, if the reset detection can not be effected upon the integrated value reaching 0 volts then the meaning of the reset sensing is lost.

(4) It is required to render the value of the operation detecting level $V_{D1}$ higher than the integrated value $V_H$ by a value which is equal to one half of the difference between $V_{D2}$ and 0 for the following reasons:

It is assumed that, due to the occurrence of a fault, a time interval of the two AC input signal $I_1$ and $I_2$ having the same polarity is longer than that of their having a dissimilar polarity and corresponds, for example, to a phase interval of $(90+\theta)$ degrees which is greater than 90 degrees and the operation detecting level $V_{D1}$ is reached at the phase of $(90+\theta)$ degrees relative to a phase of the initiation of the integration. Under the assumed conditions, $$V_{D1} = \frac{90 + \theta}{90} \cdot V_H \qquad (1)$$

because the integrated value at a phase of 90 degrees is of $V_H$. Then a time interval of the dissimilar polarily is entered and the discharge is effected for a time interval corresponding to a phase interval of $(90-\theta)$ degrees. As a result, a discharged quantity at that time may be expressed by $$\frac{90 - \theta}{90} \times V_H.$$

Thus, an integrated or a discharged value y after one half cycle of the AC input may be expressed by $$y = V_{D1} - \frac{90 - \theta}{90} \cdot V_H \qquad (2)$$

and substituting the expression (1) into the expression (2), results in $$y = 2(V_{D1} - V_H). \qquad (3)$$

When the operation detecting level $V_{D1}$ is reached with the phase difference of $(90+\theta)$ degrees between the two AC inputs $I_1$ and $I_2$, the reached level is a limit of the operation. Thus, it is required to equal y to the $V_{D2}$ so that the reset detecting level has a limit value as defined by the integrated value after the discharge. Accordingly by substituting $V_{D2}$ for y in the expression (3), $$V_{D1} = \frac{V_{D2}}{2} + V_H \qquad (4)$$

is obtained. Therefore, it is seen that the reset detecting level $V_{D1}$ should be set to be higher than $V_{D1}$ by $V_{D2}/2$.

Figure 6:
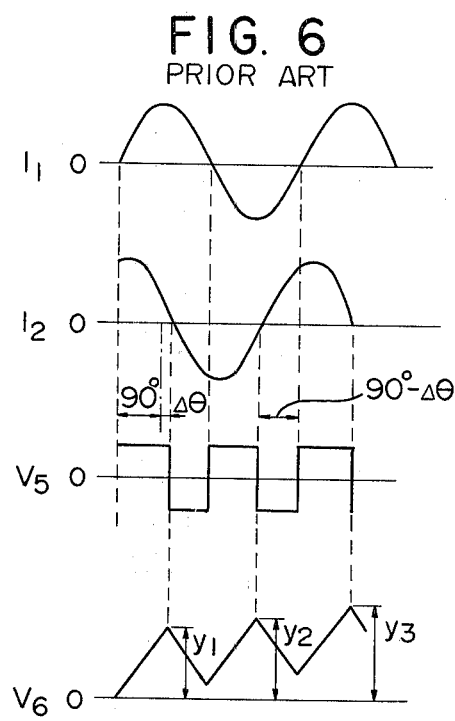
FIG. 6 is a graph illustrating waveforms useful in explaining the disadvantages of the arrangement shown in FIG. 1.

FIG. 6 is a graph useful in explaining the disadvantages of conventional integrating phase discriminator circuits such as described above in conjunction with FIGS. 1, 2, 3, 4 and 5. FIG. 6 describes a time delay with which the operation detection is effected. That time delay is due to the fact that the operation detecting level $V_{D1}$ is higher than the integrated value $V_H$ by $V_{D2}/2$ as described above in conjunction with FIG. 5.

When the two AC input signals $I_1$ and $I_2$ have the same polarity for a time interval corresponding to the phase interval of $(90+\Delta\theta)$ degrees as shown by waveforms $I_1$ and $I_2$ in FIG. 6, the output voltage $V_5$ from the zero shifting circuit 18 includes positive rectangular waveforms having their duration equal to the phase interval of $(90+\Delta\theta)$ degrees as shown by waveform $V_5$ in FIG. 6. Therefore, an integrated value $y_1$ due to a first charge may be expressed by $$y_1 = \frac{90 + \Delta\theta}{90} \times V_H$$

and a second integrated value $y_2$ may be expressed by $$y_2 = y_1 - \frac{90 - \Delta\theta}{90} \times V_H = \frac{2\Delta\theta}{90} \times V_H.$$

Similarly, an integrated value $y_n$ due to an n-th charge may be expressed by $$y_n = \left(1 + \frac{(2n-1)\Delta\theta}{90}\right) \times V_H.$$

The integrated value $y_n$ is gradually increased by n as seen from waveform $V_6$ shown in FIG. 6. When the integrated value $y_n$ reaches the operation detecting level $V_{D1}$, the level detector circuit 22 provides the operating signal. Thus, $$\left(1 + \frac{(2n-1)\Delta\theta}{90}\right) \times V_H = V_{D1}$$

is obtained. By substituting the expression (4) into the above expression, n is given by $$n = \frac{45 V_{D2}}{2\Delta\theta \times V_H} + \tfrac{1}{2}$$

From the foregoing it is seen that, for a very small $\Delta\theta$, n charges are effected until the integrated value reaches the operation detecting level $V_{D1}$ after having exceeded $V_H$. In other words, n/2 cycles of the AC input lapses till the integrated value reaches $V_{D1}$.

Also, when the integrated value is changed from the operating state corresponding to the upper limit $E_P$ to the inoperative state to render a discharged quantity greater than a corresponding charged quantity, time goes by till the resetting as in the case the integrated value reaches the operation sensing level. This is because when the two AC inputs have a phase difference approximating an angle of 90 degrees, a time interval in which they have a dissimilar polarily corresponding to $(90+\Delta\theta)$ degrees.

Therefore, conventional integrating phase discriminator circuits such as shown in FIG. 1 have been disadvantageous in that an operation and a reset detecting time point are delayed.

The present invention contemplates providing an integrating phase discriminator circuit which operates and resets fast and which has a circuit configuration for lowering an operation detecting level and raising a reset detecting level as compared with the prior art practice through the addition of a differentiation circuit for forcibly raising an integrated value to the upper limit of the integration under the conditions for an operation detecting level and for forcibly lowering the integrated value to a value at which the integration is initiated under the conditions for a reset detecting level.

Figures 7, 10:
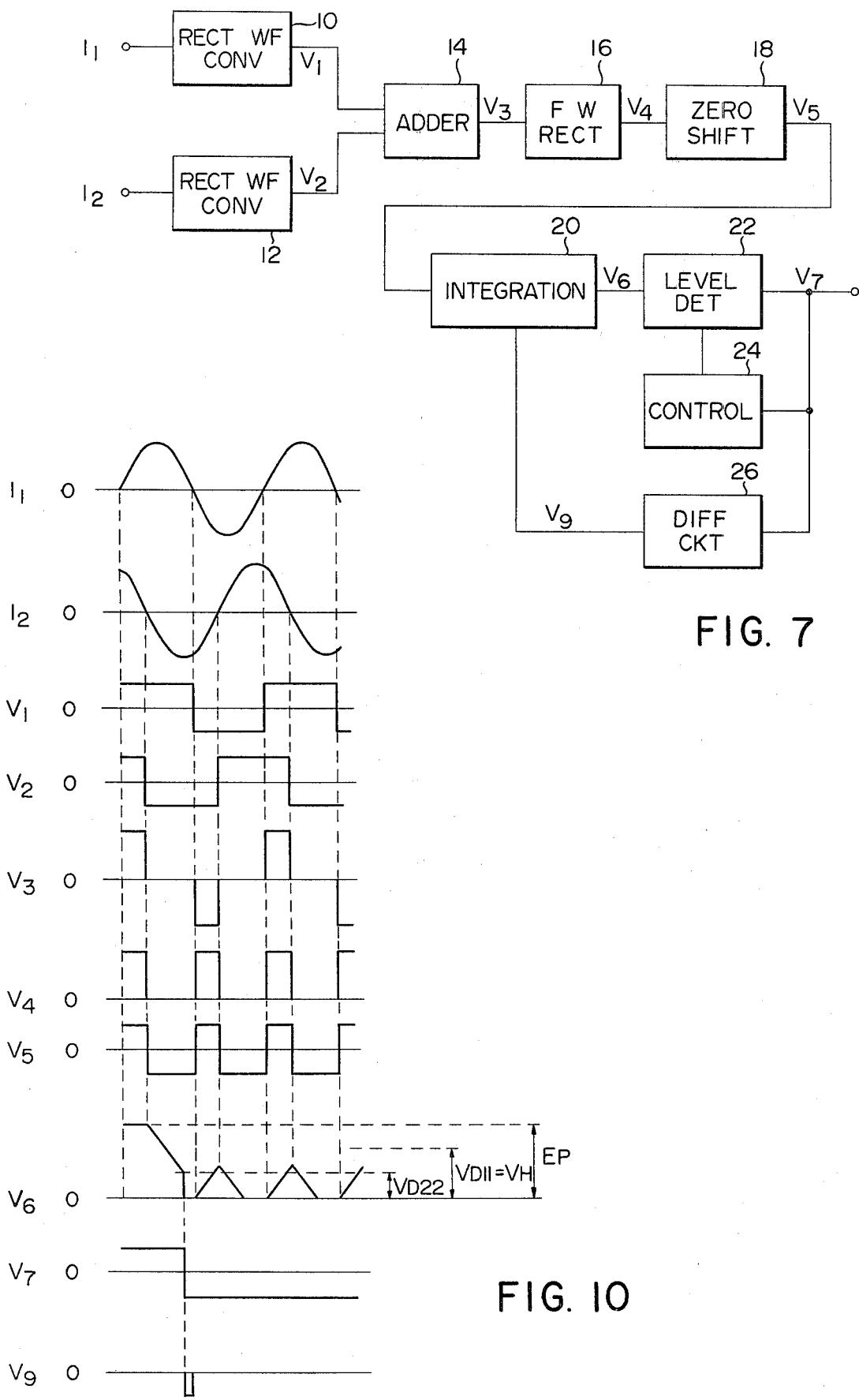
FIG. 7 is a block diagram of one embodiment according to the integrating phase discriminator circuit of the present invention.
FIG. 10 is a graph which is similar to FIG. 9 but illustrating the reset state of the arrangement shown in FIGS. 7 and 8.

Referring now to FIG. 7 wherein like reference numerals designate the components identical to those shown in FIG. 1, there is illustrated one embodiment according to the integrating phase discriminator circuit of the present invention. The illustrated arrangement is different from that shown FIG. 1 only in that in FIG. 7, a differentiation circuit 26 has its output connected to the integration circuit 20 and has its input connected to the outputs of both the level detector circuit 22 and the control circuit 24. The differentiation circuit 26 operates when the level detector circuit 22 is put under the conditions for the operation detecting level to generate a positive differentiated pulse so as to raise the integrated value from the integration circuit 20 to the upper limit of the integrated quantity and, when the level detector circuit 22 is put under the conditions for the reset detecting level, to generate a negative differentiated pulse so as to lower the integrated value from the integration circuit 20 to the value of the initiation of the integration.

Figure 8:
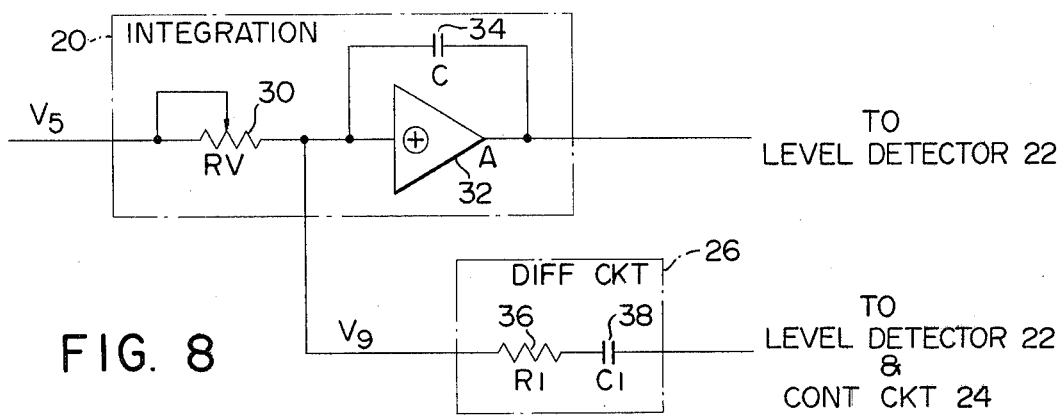
FIG. 8 is a block diagram of the details of the integration and differentiation circuits shown in FIG. 7.

FIG. 8 is a circuit diagram of the details of both the integration and differentiation circuits 20 and 26. The illustrated arrangement comprises: an integration circuit 20 including a variable resistor 30 connected to the zero shifting circuit 18 (not shown), an operational amplifier 32 having its input connected to the variable resistor 30 and having a feedback capacitor 34 connected across the output and input of the operational amplifier 32, and a differentiation circuit 26 including a series combination of a resistor 36 and a capacitor 38. The resistor 36 is connected to the input of the operational amplifier 32 and the capacitor 38 is connected to both the output of the level detector circuit 22 and the input to the control circuit 24.

The differentiation circuit 26 differentiates the output voltage $V_7$ from the level detector circuit 22 and applies a differentiated pulse to the input to the operational amplifier 32.

The operational amplifier 32 is responsive to a positive pulse from the differentiation circuit 26 to immediately cause its output to reach the upper limit $E_P$ and is responsive to a negative pulse from the differentiation circuit to immediately render its output equal to zero.

Figure 9:
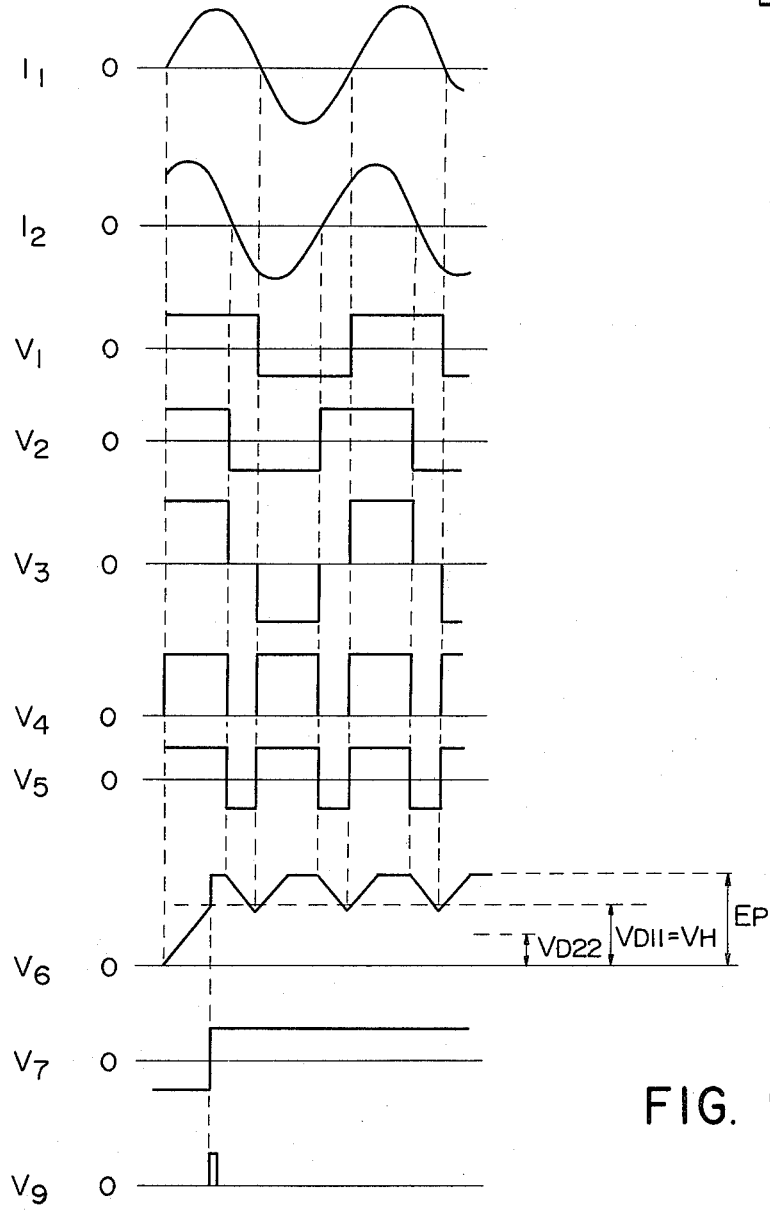
FIG. 9 is a graph illustrating waveforms developed at various points in the arrangement shown in FIGS. 7 and 8 when the arrangement is in the operating state.

The operation of the arrangement shown in FIG. 7 will now be described in conjunction with FIGS. 9 and 10. FIG. 9 illustrates waveforms developed at the same points as those shown in FIGS. 2, 3 or 4 and at the output of the differentiation circuit 26 in the arrangement of FIG. 7 put in the operating state and FIG. 10 shows waveforms similar to those illustrated in FIG. 9 but illustrates the arrangement of FIG. 7 put in the inoperative state.

Thus, FIG. 9 corresponds to FIG. 4 and shows waveforms $I_1$ and $I_2$ for the first and second AC inputs $I_1$ and $I_2$ having a phase difference of less than 90 degrees therebetween. Also, waveforms $V_1$, $V_2$, $V_3$, $V_4$ and $V_5$ shown in FIG. 9 are developed in the manner as described above in conjunction with FIGS. 2 and 4. Also, waveform $V_6$ is similar to that shown in FIG. 4 excepting that in FIG. 9, the level detector circuit 22 has the operation detecting level $V_{D11}$ equal to the integrated value $V_H$ at a phase of 90 degrees from the integration circuit 20. Accordingly, the level detector circuit 22 delivers the output voltage $V_7$ forming the operating signal at the instant the integrated value $V_6$ reaches the operation sensing level $V_{D11}$ (see waveforms $V_6$ and $V_7$ of FIG. 9).

On the other hand, the differentiation circuit 26 is responsive to the transition of the inoperative or negative signal to the operating or positive signal to generate a positive differentiated pulse as shown by waveform $V_9$ in FIG. 9. The positive pulse $V_9$ is applied to the input of the operational amplifier 32 in the integration circuit 20 with the result that the output voltage $V_6$ from the integration circuit 20 is forcibly raised from the integrated value $V_{D11}$ to its upper limit $E_P$ as shown by waveform 6 in FIG. 9.

Also, as the level detector circuit 22 delivers the operating signal, the control circuit 24 controls the same so as to set its detecting level equal to the reset detecting level $V_{D22}$ which is, in turn, equal to the discharge integrated value $V_H$ at a phase of 90 degrees subtracted from the upper limit $E_P$ or $E_P-V_H$. This results in the level detector circuit 22 continuously delivering the operating signal as shown by waveform $V_7$ in FIG. 9.

Since the level detector circuit 22 has its operation detecting level $V_{D11}$ equal to $V_H$, it is seen that the operation is performed at a high speed without any time delay.

FIG. 10 illustrates the inoperative state of the arrangement shown in FIG. 7 because the two AC inputs $I_1$ and $I_2$ have a phase difference of more than 90 degrees therebetween (see waveforms $I_1$ and $I_2$ of FIG. 10) and therefore corresponds to FIGS. 2 and 3. In FIG. 10, waveforms $V_1$, $V_2$, $V_3$, $V_4$ and $V_5$ are developed in the manner as described above in conjunction with FIGS. 2 and 3. Waveform $V_6$ shown in FIG. 10 illustrates that the output voltage from the integration circuit 20 reaches the reset detecting level $V_{D22}$ to change the output voltage $V_7$ from the level detector circuit 22 from the operating to the inoperative signal. This is because the two AC inputs $I_1$ and $I_2$ have the dissimilar polarity for a longer time duration than they have the same polarity, thereby rendering the charged quantity from the integration circuit 20 greater than the discharged quantity therefrom.

The differentiation circuit 26 generates a negative differentiated pulse (see waveform $V_7$, FIG. 10) in response to the transition from the operating or positive signal to the inoperative or negative signal from the level detector circuit 22. The negative pulse $V_9$ is applied to the input of the operational amplifier 32 in the integration circuit 18 to forcibly lower the output voltage $V_6$ from the integrated value $V_{D22}$ to the lower limit of 0 volts. Also, since the level detector circuit 22 now delivers a resetting signal, the control circuit 24 is operated so that the detecting level of the level detector circuit 22 is equal to the operation sensing level $V_{D11}$, resulting in the level detector circuit 22 continuously delivering the resetting signal (see waveform $V_7$, of FIG. 10).

Since the reset detecting level $V_{D22}$ is equal to the integrated value $V_H$ at a phase of 90 degrees but is not equal to the upper limit $E_P$, it is seen that the reset is effected at a high speed without any time delay.

In summary, the present invention comprises a differentiation circuit for differentiating a change in output from the level detector circuit resulting from an integrated value which is from an integration circuit reaching the operation or reset detecting level and feeding the resulting pulse back to the integration circuit. Therefore, the present invention gives the great result that the operation and reset can be performed without the time delay which is unavoidably required in the prior art.

In addition, the present invention is advantageous in that the detecting ability has a tolerance, although it depends upon a change in temperature, because a difference between the upper limit $E_P$ and the operation detecting level $V_{D11}$ can be set to be greater than a corresponding difference previously used. This is evident from the fact that, by respectively substituting $(E_P-V_{D11})$ according to the present circuits and $(E_P-V_{D1})$ according to conventional circuits into the expression (4) and comparing them with each other, $$(E_P - V_{D11}) - (E_P - V_{D1}) = (E_P - V_H) - \left(E_P - \frac{V_{D2}}{2} - V_H\right) = \frac{V_{D2}}{2}$$

yields and describes that $(E_P-V_{D11})$ is greater than $(E_P-V_{D1})$ by $V_{D2}/2$. Also, the comparison of the reset detecting level $V_{D2}$ with the lower limit 0 volt offers a proof that the present circuit is greater in tolerance than the conventional circuits.

In conventional circuits, the meaning of the reset detection is lost in the case the reset detecting level $V_{D2}$ can not be detected upon the resetting due to a change in temperature. Therefore, a difference of $V_{D2}$ has been given. Like this, a tolerance expressed by $E_P-V_{D1}=V_{D2}$ has been set with respect to the upper limit $E_P$ so that the operation detecting level $V_{D1}$ can be detected upon the operation even though the temperature changes. Substituting $V_{D2}$ into the expression (4) results in $$V_{D2} \tfrac{2}{3}(E_P-V_H).$$

On the other hand, the present invention uses the reset detecting level $V_{D22}$ expressed by $V_{D22}=E_P-V_H$. Therefore, $$V_{D22}-V_{D2}=\tfrac{1}{3}(E_P-V_H)$$

indicates a difference in tolerance between the circuit of the present invention and conventional circuits which is certainly greater than a zero.

The present invention is applicable to relays for determining predetermined phases, for example ground fault directional relays and distance relays. For ground fault directional relays, the first and second AC inputs $I_1$ and $I_2$, as described above, are respectively formed of the zero phase sequence current and voltage. Also, for distance relays, the first AC input $I_1$ comprises the calculated voltage and the second AC input signal $I_2$ comprises the reference voltage.

While the present invention has been illustrated and described in conjunction with a single preferred embodiment thereof, it is to be understood that numerous changes and modifications may be resorted to without departing from the spirit and scope of the present invention. For example, while the present invention has been described in conjunction with means for converting the first and second AC inputs to respective rectangular waveforms, adding the rectangular waveforms to each other and full-wave rectifying the sum of the rectangular waveforms, it is to be understood that those means may be replaced by means for sensing the same or dissimilar polarity of the first and second AC inputs followed by their application to the zero shifting circuit.

What is claimed:

1. An integrating phase discriminator circuit comprising a circuit for delivering an output when a first and a second AC electric quantity are identical in polarity to each other, a zero shifting circuit for shifting a zero point of said output from said circuit, an integration circuit for integrating an output from said zero shifting circuit, a level detector circuit having a first detecting level and a second detecting level which is lower than said first detecting level, said level detector circuit being responsive to said output from said integration circuit reaching said first detecting level so as to produce an output of a first polarity and being responsive to said output from said integration circuit reaching said second detecting level so to produce an output of a second polarity, a control circuit which is responsive to said output of said first polarity from said level detector circuit so as to change said first detecting level to said second detecting level and which is responsive to said output of the second polarity from said level detector circuit so as to change said second detecting level to said first detecting level, and a differentiation circuit for changing said output from said integration circuit to a first limit when said output from said level detector circuit changes from its second polarity to its first polarity and for changing said output from said integration circuit to a second limit when said output from said level detection circuit changes from its first polarity to its second polarity.

2. An integrating phase discriminator circuit as claimed in claim 1, wherein said differentiation circuit includes a series combination of a resistor and a capacitor.

3. An integrating phase discriminator circuit as claimed in claim 2, wherein said integration circuit includes an operational amplifier having an input connected to an output of said differentiation circuit.

* * * * *